United States Patent
Senga et al.

(10) Patent No.: US 9,878,391 B2
(45) Date of Patent: Jan. 30, 2018

(54) SOLDER SUPPLY DEVICE

(71) Applicant: FUJI MACHINE MFG. CO., LTD., Chiryu (JP)

(72) Inventors: Akihiro Senga, Okazaki (JP); Yasunori Kamegai, Owariasahi (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/122,139

(22) PCT Filed: Mar. 7, 2014

(86) PCT No.: PCT/JP2014/056021
§ 371 (c)(1),
(2) Date: Aug. 26, 2016

(87) PCT Pub. No.: WO2015/132965
PCT Pub. Date: Sep. 11, 2015

(65) Prior Publication Data
US 2016/0368072 A1 Dec. 22, 2016

(51) Int. Cl.
*B23K 3/06* (2006.01)
*H05K 3/12* (2006.01)
*H05K 3/34* (2006.01)

(52) U.S. Cl.
CPC .......... *B23K 3/0638* (2013.01); *H05K 3/1233* (2013.01); *H05K 3/3484* (2013.01)

(58) Field of Classification Search
CPC ... B23K 3/0638; B23K 1/0016; H05K 3/1233
(Continued)

(56) References Cited

U.S. PATENT DOCUMENTS 9,016,197 B2   4/2015   Kobayashi et al.
2002/0084305 A1   7/2002   Pedigo
(Continued)

FOREIGN PATENT DOCUMENTS

JP   2-75366 A   3/1990
JP   2003-535465 A   11/2003
(Continued)

OTHER PUBLICATIONS

Extended European Search Report dated Feb. 15, 2017 in Patent Application No. 14884293.3.
(Continued)

*Primary Examiner* — Erin B Saad
(74) *Attorney, Agent, or Firm* — Oblon, McClelland, Maier & Neustadt, L.L.P.

(57) ABSTRACT

A solder supply device provided with solder cup 70 housing liquid solder that is cylindrical and open at one end, and supply nozzle 74 that is inserted into the solder cup, that supplies solder from inside the solder cup by moving the solder cup by supplying air to space 86, wherein a fixed amount of air is supplied in a case in which the solder cup movement distance is less than a specified distance, and a greater amount of air than the above specified amount is supplied in a case in which the solder cup movement distance is the set movement distance or greater. That is, when supplying solder, in a case in which the volume of the space to which air is supplied is a specified volume or greater, a greater amount of air is supplied than the air supply amount for when the volume of the space is a specified volume or less. Thus, even in a case in which the volume of the space is equal to or greater than the specified volume, it is possible to supply the same amount of solder as the solder supply volume in a case in which the volume of the space is less than the specified volume, thus it is
(Continued)

possible to control operation of the solder supply device considering differential head.

4 Claims, 7 Drawing Sheets

(58) Field of Classification Search
USPC .................................................... 137/565.01
See application file for complete search history.

(56) References Cited

U.S. PATENT DOCUMENTS

2016/0297021 A1* 10/2016 Senga ...................... B23K 3/06
2016/0303675 A1* 10/2016 Fujita ................... H05K 3/3484

FOREIGN PATENT DOCUMENTS

| | | |
|---|---|---|
| JP | 2010-172928 A | 8/2010 |
| JP | 2011-31301 A | 2/2011 |
| JP | 2012-148451 A | 8/2012 |
| WO | 2013/114479 A1 | 8/2013 |

OTHER PUBLICATIONS

International Search Report dated May 20, 2014 in PCT/JP14/056021 Filed Mar. 7, 2014.
Japanese Office Action dated Oct. 24, 2017 in Japanese Application No. 2016-506062US (with translation) 7 pages.

* cited by examiner

SOLDER SUPPLY DEVICE

TECHNICAL FIELD

The present application relates to a solder supply device for supplying solder from a solder container housing liquid solder, the solder container being tubular and open at one end.

BACKGROUND ART

Among solder supply devices, there is a solder supply device that has a solder container housing liquid solder inside thereof, and a piston engaged inside the solder container, and that supplies solder in the solder container by raising the pressure inside the solder container by moving at least one of the solder container and the piston. In the patent literature below, disclosed is an example of a solder supply device that supplies solder inside a solder container by moving at least one of the solder container and a piston by the driving of a servo motor. Also disclosed in the patent literature below is technology for supplying an appropriate amount of solder by performing feedback control for the driving of the servo motor.
Patent Literature 1: JP-A-2012-148451

SUMMARY

According to the solder supply device disclosed in the above patent literature, to a certain extent it is possible to supply an appropriate amount of solder. However, with the solder supply device disclosed in the above patent literature, because the configuration is such that at least one of the solder container and the piston are moved by the driving of the servo motor, problems of a solder supply device that moves at least one of a solder container and a piston by supplying air are not considered.

Specifically, with a solder supply device that moves at least one of a solder container and a piston by supplying air, at least one of the solder container and the piston are moved by supplying air to an air chamber or the like. Here, the volume of the air chamber increases due to the movement of at least one of the solder container and the piston. If the volume of the air chamber increases, a time lag occurs for the movement of at least one of the solder container and the piston when air is supplied inside the air chamber, leading to a smaller amount of solder being supplied. This phenomenon is known as differential head, and with a solder supply device that moves at least one of a solder container and a piston by supplying air, control must be performed considering this differential head. The present disclosure takes account of such problems and an object thereof is to control operation of a solder supply device considering differential head.

To solve the above problems, the solder supply device of one aspect comprises a solder container housing liquid solder that is tubular and open at one end; a nozzle, for ejecting solder from the solder container, that is inserted into the solder container; a piston that is fixedly provided on an outer circumferential section of the nozzle and that is engaged inside of the solder container from the opening of the solder container; a moving device that moves at least one of the solder container and the piston such that the piston progresses into the solder container; a sensor that detects the relative movement distance of the solder container and the piston; and a control device that controls operation of the moving device such that solder is supplied from the tip of the nozzle by operation of the moving device; wherein the control device includes a first control section that controls operation of the moving device such that, in a case in which the relative movement distance detected by the sensor is less than a set distance, at least one of the solder container and the piston is moved with a specified force, and a second control section that controls operation of the moving device such that, in a case in which the relative movement distance detected by the sensor is equal to or greater than the set distance, at least one of the solder container and the piston is moved with a force greater than the specified force.

Further, in the solder supply device of another aspect, the moving device moves at least one of the solder container and the piston by supplying air, the first control section controls operation of the moving device such that, in a case in which the relative movement distance detected by the sensor is less than the set distance, at least one of the solder container and the piston is moved by supplying a specified amount of air to the moving device, and the second control section controls operation of the moving device such that, in a case in which the relative movement distance detected by the sensor is equal to or greater than the set distance, at least one of the solder container and the piston is moved by supplying an amount of air greater than the specified amount to the moving device.

Further, in the solder supply device of another aspect, the solder supply device is further provided with an outer tube that is tubular with an opening at one end and that stores the solder container in a state with the other end of the solder container engaged from the opening, and the solder container is moved by air being supplied to an air chamber that is demarcated by the other end of the solder container and the other end of the outer tube.

Further, the solder supply of another aspect is further provided with an adjustment mechanism capable of adjusting the arrangement position of the sensor in the movement direction of at least one of the solder container and the piston.

Advantageous Effects

With the solder supply device according to an aspect, in a case in which the relative movement distance of the solder container and the piston is less than a set distance, at least one of the solder container and the piston is moved with a specified force. In contrast, in a case in which the relative movement amount of the solder container and the piston is equal to or greater than the specified distance, at least one of the solder container and the piston is moved with a force greater than the specified force. That is, when moving at least one of the solder container and the piston, in a case in which the volume of the air chamber to which air is supplied is equal to or larger than a specified volume, at least one of the solder container and the piston is moved by a force greater than the force when the volume of the air chamber is less than a specified volume. By this, even in a case in which the volume of the air chamber is equal to or greater than the specified volume, it is possible to supply the same amount of solder as the solder supply volume in a case in which the volume of the air chamber is less than the specified volume, thus it is possible to control operation of the solder supply device considering differential head.

Also, the solder supply device of another aspect is limited to a solder supply device that moves at least one of a solder container and a piston by supplying air. Thus, with the solder supply device of the aspect, it is possible to sufficiently exhibit the effects of the control of the solder supply device considering differential head.

Also, with the solder supply device of another aspect, the solder container is engaged from the bottom surface inside a tubular outer tube that has a bottom surface. And, by air being supplied to an air chamber demarcated by the bottom surface of the outer tube and the bottom surface of the solder container, at least one of the solder container and the piston moves. With the solder supply device with such a configuration, because the volume of the air chamber changes relatively more due to air being supplied, the effects of differential head have a large influence. Thus, with the solder supply device of the aspect, it is possible to sufficiently exhibit the effects of the control of the solder supply device considering differential head.

Also, with the solder supply device of another aspect, the arrangement position of the sensor that detects the relative movement distance of the solder container and the piston is adjustable in the movement direction of at least one of the solder container and the piston. The effects of differential head are extremely large if the volume of the air chamber or the like exceeds the specified size, therefore it is necessary to detect the relative movement distance of the solder container and the piston when the volume of the air chamber exceeds the specified size. Thus, according to the sensor that detects the relative movement distance of the solder container and the piston, it is possible to appropriately detect the timing at which the volume of the air chamber or the like becomes the specified size. However, the volume of an air chamber or the like for which the effect of differential head is extremely large varies according to the viscosity of the solder and so on. Therefore, according to the solder supply device of the aspect, it is possible to deal with variations in the volume of the air chamber for which the effect of differential head is extremely large, and various types of solders can be handled.

DESCRIPTION OF PREFERRED
EMBODIMENTS

Figure 1:
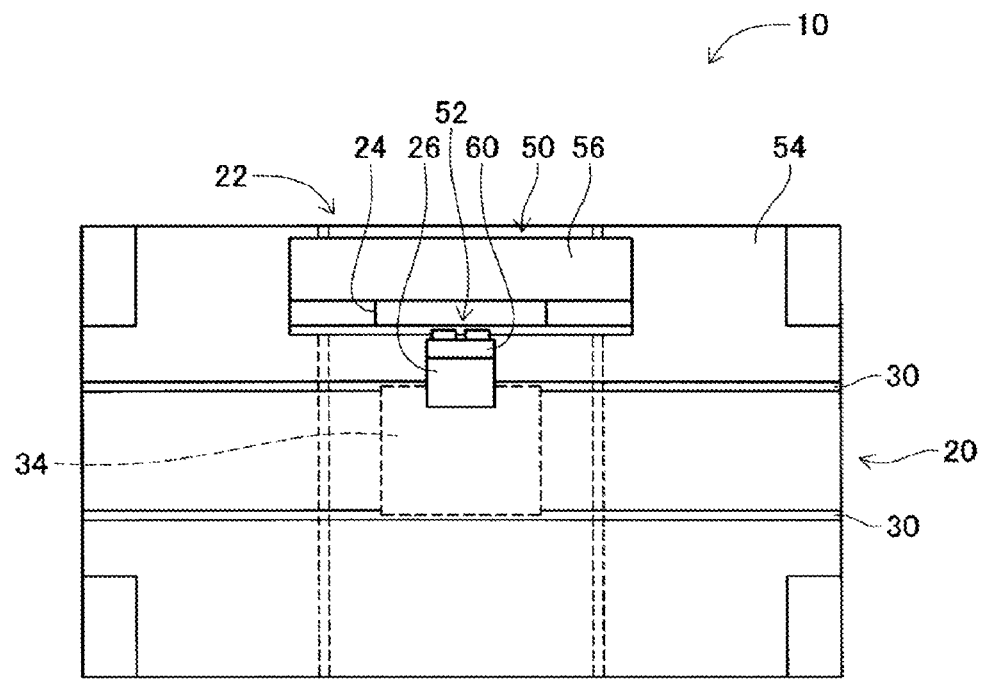
FIG. 1 is a plan view showing a solder printer of an embodiment.
Figure 1:
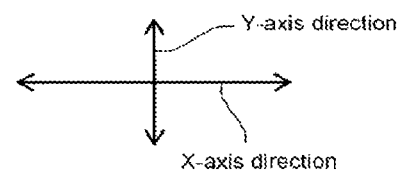

The following describes in detail referring to the figures an example embodiment of the present disclosure.
Solder Printer Configuration
FIG. 1 shows solder printer 10, an embodiment of the present disclosure. Solder printer 10 is a device that prints solder paste onto a circuit board. Solder printer 10 is provided with conveyance device 20, moving device 22, squeegee device 24, and solder supply device 26.

Conveyance device 20 has a pair of conveyor belts 30 that extend in the X-axis direction, and electromagnetic motor (refer to FIG. 4) 32 that moves conveyor belts 30. The pair of conveyor belts 30 support circuit board 34 and circuit board 34 is conveyed in the X-axis direction by the driving of electromagnetic motor 32. Also, conveyance device 20 has holding device (refer to FIG. 4) 36. Holding device 36 fixedly holds circuit board 34 supported by conveyor belts 30 in a predetermined position (the position at which circuit board 34 is shown in FIG. 1). Note that a metal mask (not shown) is loaded on the upper surface of circuit board 34.

Moving device 22 is configured from Y-axis direction slide mechanism 50 and X-axis direction slide mechanism 52. Y-axis direction slide mechanism 50 has Y-axis slider 56 provided on base 54 so as to be movable in the Y-axis direction. Y-axis slider 56 is moved to any position in the Y-axis direction by the driving of electromagnetic motor (refer to FIG. 4) 58. Also, X-axis direction slide mechanism 52 has X-axis slider 60 provided on a side surface of Y-axis slider 56 to be movable in the X-axis direction. X-axis slider 60 is moved to any position in the X-axis direction by the driving of electromagnetic motor (refer to FIG. 4) 62.

Squeegee device 24 is attached to Y-axis slider 56 about conveyance device 20, and moves to any position above circuit board 34 that is held by conveyance device 20. Squeegee device 24 has a squeegee (not shown) and the squeegee is held extending downwards by squeegee device 24 to be movable in the Y-axis direction and the up/down directions. Further, the squeegee is moved in the Y-axis direction by the driving of electromagnetic motor (refer to FIG. 4) 66, and is moved up/down by the driving of electromagnetic motor (refer to FIG. 4) 68.

Figure 2:
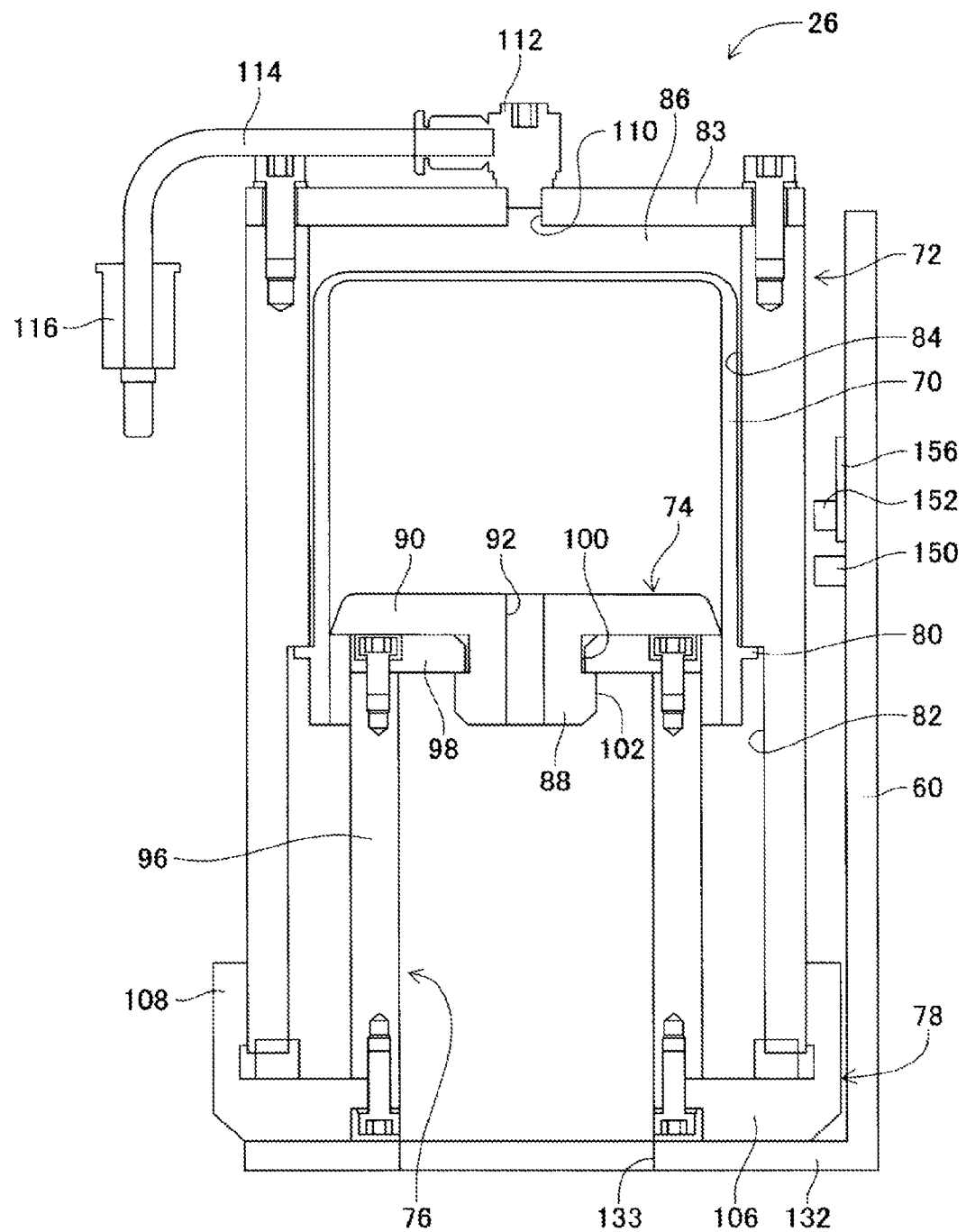
FIG. 2 is a cross-section view showing a solder supply device provided in the solder printer of FIG. 1.

Solder supply device 26 is attached to X-axis slider 60 and is moved to any position above base 54 by moving device 22. As shown in FIG. 2, solder supply device 26 has solder cup 70, outer tube 72, supply nozzle 74, inner tube 76, and fixed lid 78. Solder cup 70 is a bottomed cylindrical container with an opening at one end; solder cup 70 is filled with solder paste. Flange section 80 is formed on the outer circumferential surface at the opening side of solder cup 70; a screw thread (not shown) is formed between flange 80 and the edge of the opening side. Solder cup 70 is sold commercially with a lid (not shown) that engages with the screw thread covering the opening. That is, solder paste manufacturers sell solder cups 70 after filling solder cups 70 with solder paste and covering the opening with a lid. Users purchase solder cups 70 and use them with the lid removed.

Also, outer tube 72, similar to solder cup 70, is a bottomed cylinder with an opening at one end; solder cup 70 is stored inside outer tube 72. In detail, the inner circumferential surface of outer tube 72 is configured from first inner circumferential surface 82 that is positioned at the opening side of outer tube 72, and second inner circumferential surface 84 that is positioned at bottom surface 83 of outer tube 72. The inside diameter of first inner circumferential surface 82 is slightly larger than the outer diameter of flange section 80 of solder cup 70; the inside diameter of second inner circumferential surface 84 is slightly larger than the outer diameter of the tubular section of solder cup 70. Further, the end of the bottom side of solder cup 70 is engaged from the opening of outer tube 72 such that solder cup 70 is stored in outer tube 72. By this, solder cup 70 is slidable inside outer tube 72.

However, the depth dimension of a portion of second inner circumferential surface 84 of outer tube 72 is longer than the length dimension from flange section 80 of solder cup 70 to the bottom surface of solder cup 70, and flange section 80 of solder cup 70 contacts the step surface between first inner circumferential surface 82 and second inner circumferential surface 84 of outer tube 72. Therefore, space 86 is formed between the bottom surface of solder cup 70 and bottom surface 83 of outer tube 72. Also, outer tube 72 is formed from acrylic resin and is transparent. Note that, herein, the bottom surface refers to the surface on the opposite side to the opening of a bottomed cylindrical member. In other words, even if the surface on the opposite side to the opening of a bottomed cylindrical member is positioned towards the top, and the opening is positioned towards the bottom, the surface on the opposite side to the opening is given as the bottom surface, not the lid.

Also, supply nozzle 74 is configured from nozzle section 88 and flange section 90; nozzle section 88 and flange section 90 are formed as one body from material that is elastically deformable. Nozzle section 88 is substantially cylindrical with nozzle hole 92 formed running through the inside. Flange section 90 extends in a disk shape from the outer circumferential surface of an end of the nozzle section; the outer diameter of flange section 90 is slightly larger than the inside diameter of solder cup 70. Also, flange section 90 is engaged inside solder cup 70 such that nozzle section 88 faces the opening side of solder cup 70; supply nozzle 74 slides inside solder cup 70 with the outer circumferential section of flange section 90 elastically deformed.

Further, inner tube 76 has cylindrical tube section 96, and ring section 98 that covers the edge of tube section 96; supply nozzle 74 is held by ring section 98. In detail, the outer circumferential surface of nozzle section 88 of supply nozzle 74 is configured from first outer surface 100 positioned on the flange section 90 side and second outer circumferential surface 102 positioned at the tip side of nozzle section 88; the outer diameter of first outer diameter surface 100 is smaller than the outer diameter of second outer circumferential surface 102. On the other hand, the inside diameter of ring section 98 of inner tube 76 is slightly larger than the outer diameter of first outer circumferential surface 100 and slightly smaller than the outer diameter of second outer circumferential surface 102. Also, nozzle section 88 engages with the inside diameter section of ring section 98 while a portion of second circumferential surface 102 is elastically deformed, and the inside diameter of ring section 98 and outer circumferential surface 100 of nozzle section 88 engage. By this, inner tube 76 holds supply nozzle 74 using ring section 98. Note that, inner tube 76 holds supply nozzle 74 using ring section 98, therefore inner tube 76 is positioned inside solder cup 70; however, the end of the side not positioned at ring section 98 of tube section 96 extends from the opening of solder cup 70.

Further, fixed lid 78 has ring section 106, and erected section 108 established around the entire circumference at the outer edge of ring section 106. A screw thread (not shown) is formed on the inner circumferential surface of erected section 108, the screw thread being engaged with the screw thread (not shown) formed at the opening end side of outer tube 72. By this, fixed lid 78 is removably attached to the opening of outer tube 72. Also, the inside diameter of ring section 106 is substantially the same as the inside diameter of tube section 96 of inner tube 76, and the end section that extends from solder cup 70 of tube section 96 is fixed to the inside edge of ring section 106.

Also, through-hole 110 is formed in bottom surface 83 of outer tube 72, and air adapter 112 is attached in through-hole 110. Air adapter 112 is connected to an end of air tube 114, and the other end of air tube 114 is connected to device-side air coupler 116. By connecting slider-side air coupler (refer to FIG. 3) 118 provided at the arrangement position of solder supply device 26 to device-side air coupler 116, air is supplied to space 86 inside outer tube 72, and solder paste is ejected from nozzle hole 92 of supply nozzle 74.

Figure 3:
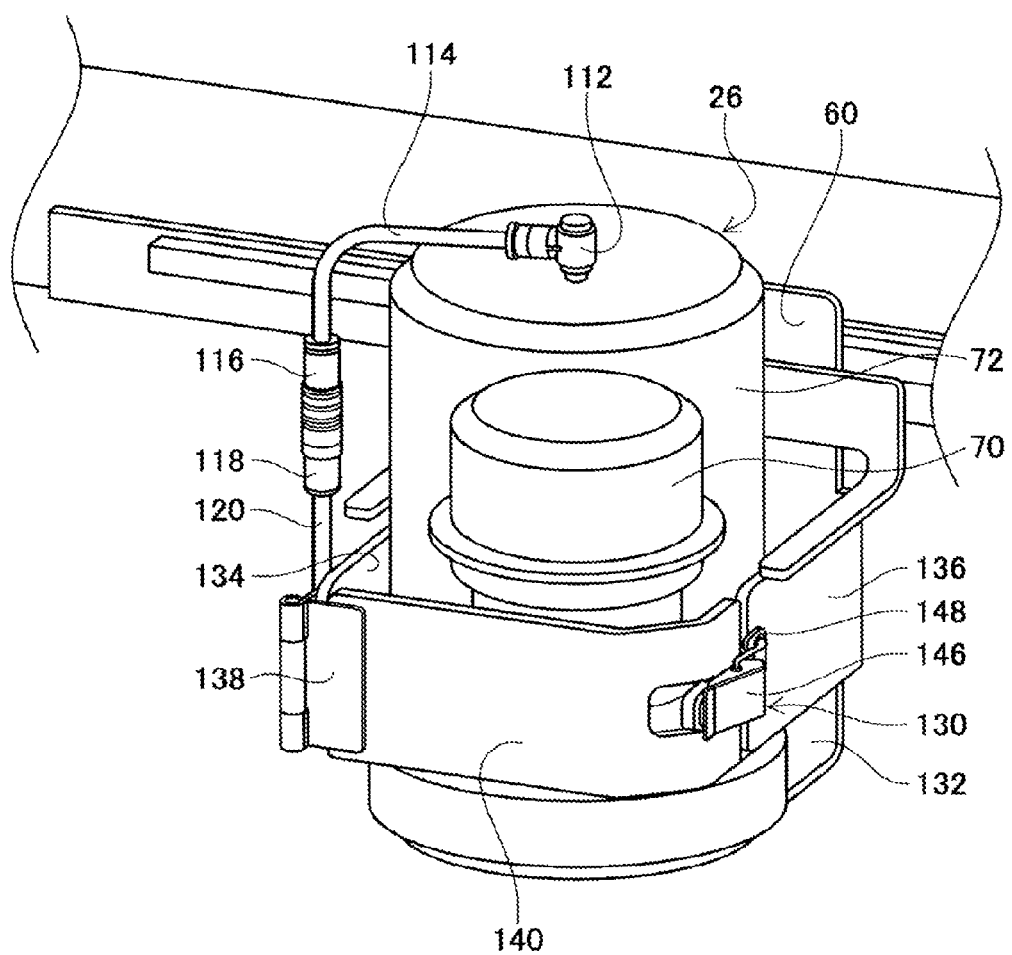
FIG. 3 is a perspective view showing the solder supply device of FIG. 2.

In detail, as shown in FIG. 3, an end of air tube 120 is connected to slider-side air coupler 118, and the other end of air tube 120 is connected to air supply device (refer to FIG. 4) 122. By this, air is supplied from air supply device 122 to space 86 inside outer tube 72. When air is supplied to space 86, the bottom surface of solder cup 70 is pressed towards supply nozzle 74 and solder cup 70 moves down. In this case, the solder paste filling solder cup 70 is compressed and is ejected from nozzle hole 92 of supply nozzle 74. Solder paste ejected from nozzle hole 92 passes through tube section 96 of inner tube 76, and the inner section of ring section 106 of fixed lid 78, and is ejected to the outside of solder supply device 26. Thus, solder supply device 26 supplies solder paste.

Also, as shown in FIG. 3, solder supply device 26 is detachably mounted on X-axis slider 60 by clip lock 130. In detail, bracket 132 is attached to the lower end of X-axis slider 60, and the lower surface of solder supply device 26 is supported by bracket 132. Through-hole (refer to FIG. 2) 133 approximately the same as the inner diameter of ring section 106 of fixed lid 78 of solder supply device 26 is formed in bracket 132. By this, solder paste is supplied from solder supply device 26 loaded on bracket 132 via through-hole 133 in bracket 132.

Two surrounding plates 134 and 136 are fixed on X-axis slider 60 above bracket 132 facing each other and perpendicular to bracket 132. The distance between the two surrounding brackets 134 and 136 is slightly longer than the outer diameter of outer tube 72 of solder supply device 26, and solder supply device 26 is loaded between the two surrounding plates 134 and 136. Also, an end of opening/closing plate 140 is attached to surrounding plate 134 via hinge 138. Lever section 146 of clip lock 130 is provided on the other end of opening/closing plate 140, and hook stopper 148 of clip lock 130 is provided on surrounding plate 136. Also, by performing locking with opening/closing plate 140 in a closed state and lever section 146 latched onto hook stopper 148, solder supply device 26 is fixedly mounted on X-axis slider 60. Also, by releasing the locking of clip lock 130 and opening opening/closing plate 140, solder supply device 26 is able to be removed from X-axis slider 60.

Further, as shown in FIG. 2, two photoelectric sensors 150 and 152 are provided on X-axis slider 60 so as to face the outer circumferential surface of outer tube 72 of solder supply device 26. Each photoelectric sensor 150 and 152 emits laser light towards outer tube 72 of solder supply device 26. As described above, because outer tube 72 is transparent, the laser light passes through outer tube 72. On the other hand, because solder cup 70 is not transparent, the laser light reflects off solder cup 70 and photoelectric sensors 150 and 152 receive the laser light reflected off solder cup 70. However, if solder cup 70 is deviated from the position at which laser light is omitted due to movement of solder cup 70, laser light from photoelectric sensor 150 and 152 is not reflected and is not received by photoelectric sensor 150 and 152. Therefore, as described in detail below, it is possible to judge whether solder cup 70 is inside outer tube 72 from a detection value of photoelectric sensor 150 and 152. That is, the movement amount of solder cup 70 inside outer tube 72 can be detected.

Note that, the two photoelectric sensors 150 and 152 are arranged on X-axis slider 60 lined up in the vertical direction. Photoelectric sensor 150 (hereinafter sometimes referred to as first photoelectric sensor 150), which is arranged the lower of the two photoelectric sensors 150 and 152, is fixedly arranged on X-axis slider 60; photoelectric sensor 152 (hereinafter sometimes referred to as second photoelectric sensor 152), which is arranged the upper of the two photoelectric sensors 150 and 152, is arranged on X-axis slider 60 via slide mechanism 156. Slide mechanism 156 holds second photoelectric sensor 152 to be slidable in the vertical direction such that second photoelectric sensor 152 is fixable at any position.

Figure 4:
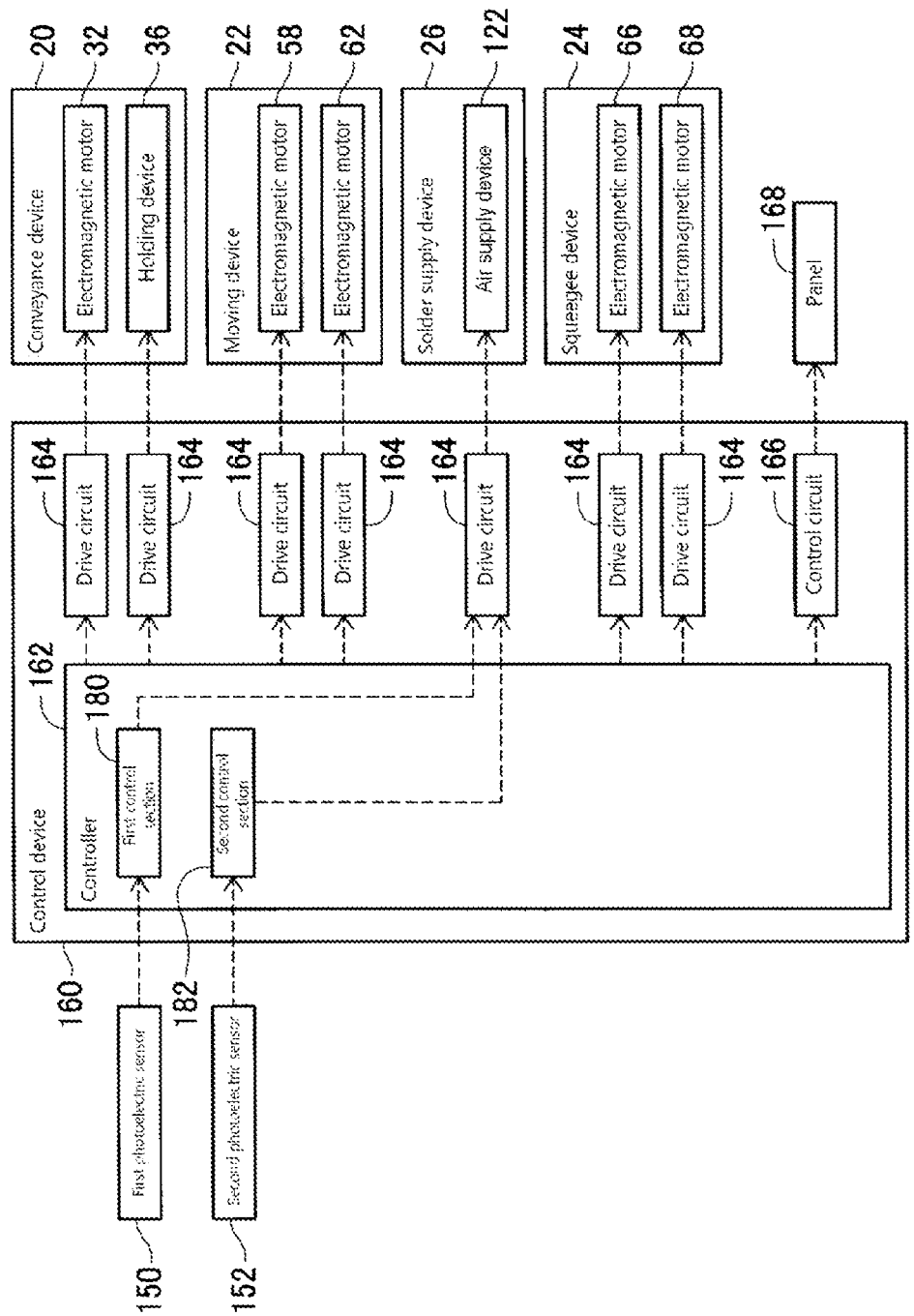
FIG. 4 is a block diagram showing the control device provided in the solder printer of FIG. 1.

Also, as shown in FIG. 4, solder printer 10 is provided with control device 160. Control device 160 is provided with controller 162, multiple drive circuits 164, and control circuit 166. Multiple drive circuits 164 are connected to the above-mentioned electromagnetic motors 32, 58, 62, 66, and 68, holding device 36, and air supply device 122. Controller 162 is provided with a CPU, ROM, RAM, and so on, is formed mainly from a computer, and is connected to the multiple drive circuits 164. Thus, the operation of conveyance device 20, moving device 22, squeegee device 24, and solder supply device 26 is controlled by controller 162. Also, controller 162 is connected to panel 168 via control circuit 166. Panel 168 is for displaying information required for work by solder printer 10, and is controlled by controller 162. Further, controller 162 is connected to photoelectric sensors 150 and 152 and acquires detection signals from photoelectric sensors 150 and 152.

Printing of Solder Paste to Circuit Board

With solder printer 10, according to the above-described configuration, solder paste is supplied onto the upper surface of a metal mask loaded on circuit board 34 by solder supply device 26, and that solder paste is applied by squeegee device 24. Pattern holes matching the pattern of the pads and so on of circuit board 34 are formed in the metal mask, and solder paste is printed onto circuit board 34 via the pattern holes.

Specifically, based on commands of controller 162, circuit board 34 is conveyed to a work position, and fixedly held at that position by holding device 36. Then, solder supply device 26, based on commands of controller 162, moves to a prescribed position above circuit board 34. Continuing, based on commands of controller 162, solder supply device 26 supplies air from air supply device 122 into space 86 inside outer tube 72. By this, solder paste is ejected from nozzle hole 92, thus supplying solder paste onto the upper surface of the metal mask loaded on circuit board 34. Next, based on commands of controller 162, squeegee device 24 is moved above the location where solder paste was supplied. Then, based on commands of controller 162, squeegee device 24 moves a squeegee down and then moves in the Y-axis direction. By this, solder paste is applied on the upper surface of the metal mask, and solder paste thus enters into the pattern holes. In this manner, solder printer 10 prints solder paste onto circuit board 34.

Detecting when Solder Runs Out in the Solder Cup

As described above, when printing solder paste onto circuit board 34, solder paste is supplied from solder cup 70 of solder supply device 26; thus, solder cup 70 becomes empty and empty solder cup 70 needs to be replaced with a solder cup 70 filled with solder paste. Therefore, with solder supply device 26, by detecting the position of solder cup 70 using photoelectric sensors 150 and 152, it is detected that the remaining amount of solder in solder cup 70 is small, and that solder in solder cup 70 has run out.

Figure 5:
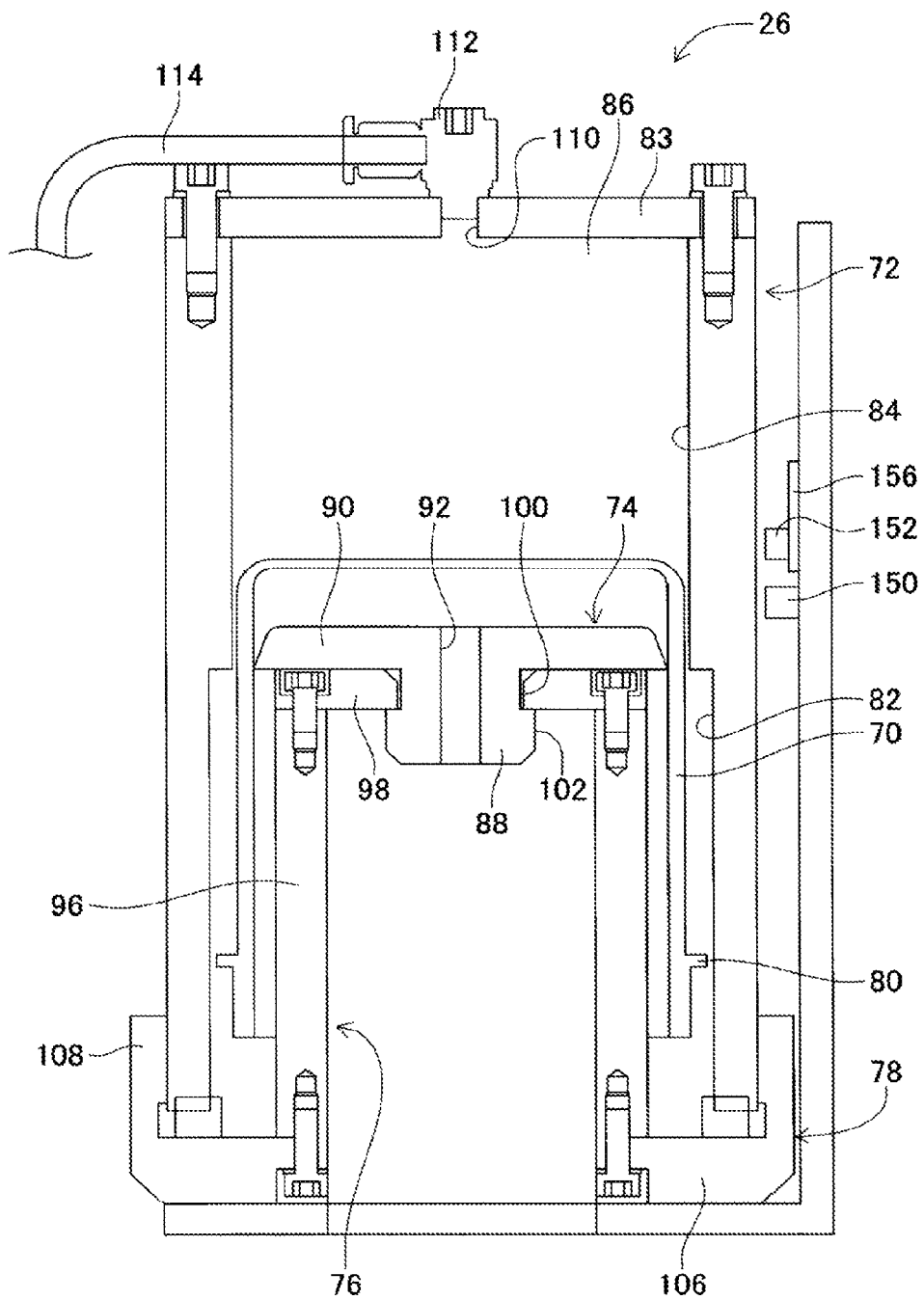
FIG. 5 is a cross-section view showing the solder supply device with little solder remaining in the solder cup.

Specifically, when supplying solder using solder supply device 26, as described above, air is supplied to space 86 inside outer tube 72 from air supply device 122. By this, the bottom surface of solder cup 70 is pressed towards supply nozzle 74 and solder cup 70 moves down. By this, as shown in FIG. 5, solder cup 70 moves below the region exposed to the laser light from second photoelectric sensor 152, and second photoelectric sensor 152 does not receive reflected laser light. That is, the input value inputted to controller 162 from second photoelectric sensor 152 changes from a value indicating that light is being received to a value indicating that light is not being received. In this case, controller 162 displays the fact that the remaining amount of solder in solder cup 70 is small on panel 168. By this, it is possible to notify an operator of the fact that the remaining amount of solder in solder cup 70 is small, thus an operator can perform preparation for solder cup exchange work.

Figure 6:
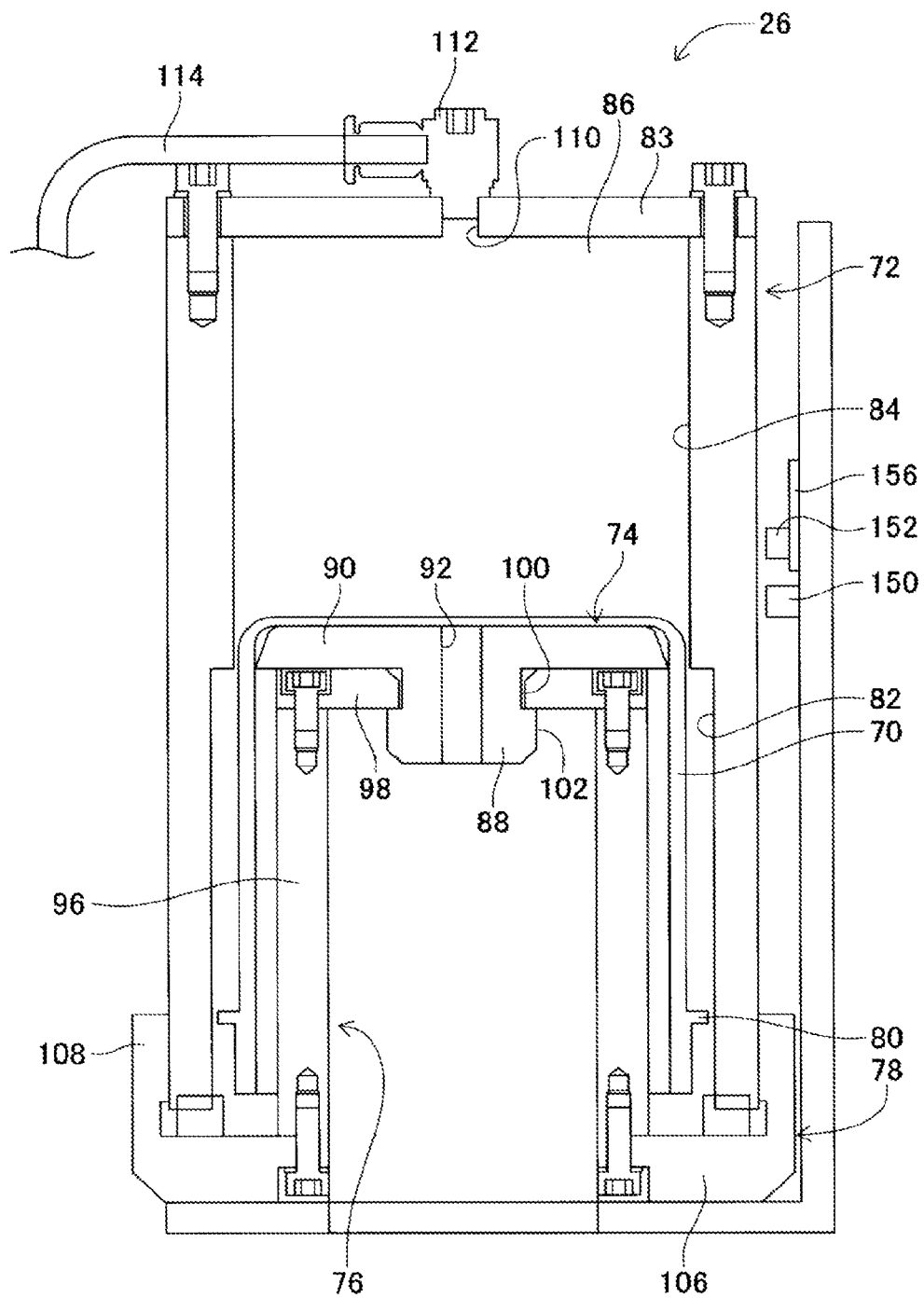
FIG. 6 is a cross-section view showing the solder supply device with an empty solder cup.

When solder is further supplied from solder supply device 26, solder cup 70 is lowered further and the bottom surface of solder cup 70 contacts supply nozzle 74. In other words, solder cup 70 becomes empty. By this, as shown in FIG. 6, solder cup 70 moves below the region exposed to the laser light from first photoelectric sensor 150, and first photoelectric sensor 150 does not receive reflected laser light. Therefore, the input value inputted to controller 162 from first photoelectric sensor 150 changes from a value indicating that light is being received to a value indicating that light is not being received. In this case, controller 162 displays the fact that solder cup 70 is empty on panel 168. By this, an operator is informed that solder cup 70 is empty, that is, that solder has run out from inside solder cup 70, and thus performs solder cup 70 exchange work.

Solder Supply Considering Differential Head

As described above, with solder supply device 26, by supplying air to space 86 inside outer tube 72, solder is supplied, but there are cases in which the solder supply amount varies based on the volume of space 86. In detail, as the volume of space 86 increases, a time lag occurs for the movement of solder cup 70 when air is supplied inside space 86, leading to a smaller amount of solder being supplied. This phenomenon is known as differential head, and it is necessary to control operation of air supply device 122 considering differential head. Therefore, with solder supply device 26, operation of air supply device 122 is controlled based on the remaining amount of solder in solder cup 70 using the fact that there is an inverse proportional relationship between the remaining amount of solder in solder cup 70 and the volume of space 86.

Figure 7:
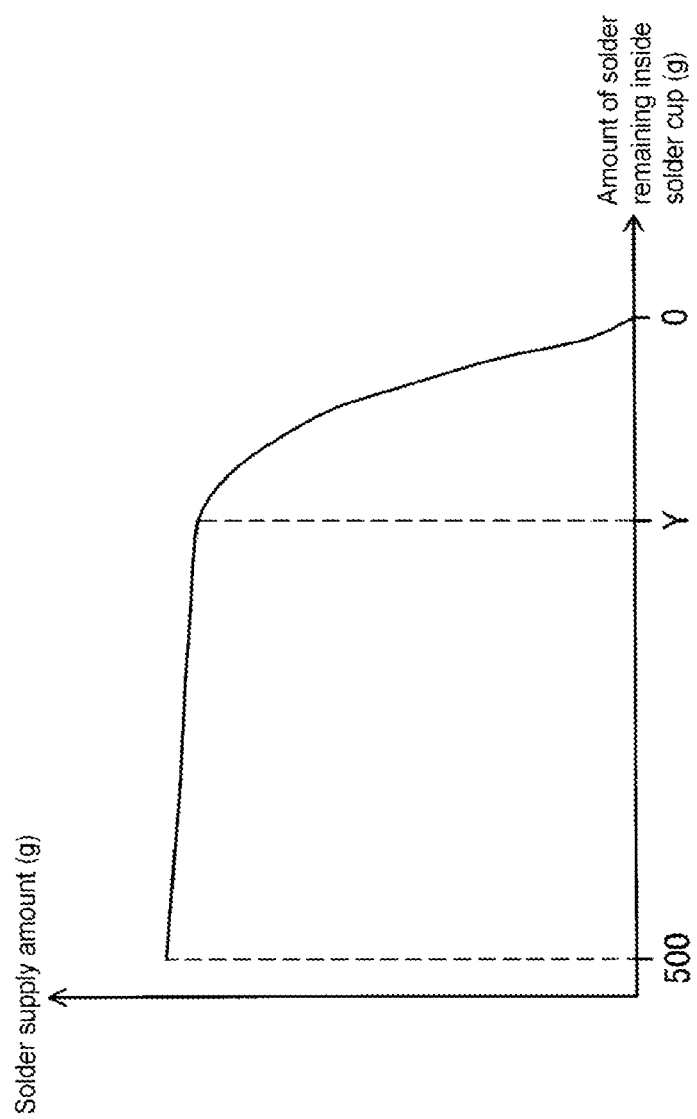
FIG. 7 is a graph showing the relationship between the amount of solder remaining in the solder cup and the solder supply amount.

This will be described in detail using the graph of FIG. 7 that shows the relationship between the amount of solder remaining in solder cup 70 and the amount of solder supplied from solder supply device 26. The vertical axis in FIG. 7 shows the amount of solder supplied from solder supply device 26 when a given amount X of air is supplied to space 86 from air supply device 122. The horizontal axis in FIG. 7 shows the amount of solder remaining in solder cup 70, with the volume of solder cup 70 being 500 g.

As seen in the graph, in a case in which the amount of solder remaining in solder cup is Y (<500) to 500 g, the amount of solder supplied from solder supply device 26 is largely fixed. However, when the amount of solder remaining in solder cup 70 becomes Yg or less, the amount of solder supplied from solder supply device 26 decreases rapidly due to the influence of differential head. Therefore, with solder supply device 26, when the amount of solder remaining in solder cup 70 is Yg or less, solder cup 70 is moved with a force greater than when the amount of solder remaining in solder cup 70 is Y to 500 g. Specifically, when the amount of solder remaining in solder cup 70 is Y to 500 g, the amount of air supplied to space 86 from air supply device 122 is taken as X, and when the amount of solder remaining in solder cup 70 is Y g or less, an amount of air greater than X is supplied to space 86 from air supply device 122. By this, even in a case in which the amount of solder remaining in solder cup 70 is Yg or less, it is possible to supply the same amount of solder as when the amount of solder remaining in solder cup 70 is Y to 500 g, thus controlling operation of solder supply device 26 considering differential head is possible.

Note that, in a case in which the amount of air supplied to space 86 when the amount of solder remaining in solder cup 70 is Yg or less is X+a (>0), a may be fixed, or may vary depending on the remaining solder amount. Specifically, for example, in a case in which the amount of air supplied per unit of time by air supply device 122 is fixed, when solder is supplied, if the amount of solder remaining in solder cup 70 is Y to 500 g, air supply device 122 supplies air to space 86 for A seconds. On the other hand, when supplying solder, if the amount of solder remaining in solder cup 70 is Yg or less, air supply device 122 may supply air to space 86 for (A+B) seconds, or {A+K×(Y−Y1)} seconds. Note that, Y1 is the amount of solder remaining in solder cup 70, and is 0 g or greater and Yg or less. K is the gain, and is set to any value greater than zero.

Also, with solder supply device 26, judgment as to whether the amount of solder remaining in solder cup 70 is Yg or less is performed by second photoelectric sensor 152. In detail, the arrangement position of second photoelectric sensor 152 is adjusted such that the bottom surface of solder cup 70 when the amount of solder remaining in solder cup 70 is Yg and the lower limit of the region in which laser light is emitted by second photoelectric sensor 152 match. Accordingly, when the amount of solder remaining in solder cup 70 is Yg or less, solder cup 70 moves below the region exposed to the laser light from second photoelectric sensor 152, and second photoelectric sensor 152 does not receive reflected laser light. That is, the input value inputted to controller 162 from second photoelectric sensor 152 changes from a value indicating that light is being received to a value indicating that light is not being received. By this, controller 162 judges that the amount of solder remaining in solder cup 70 is Yg or less. In this way, with solder supply device 26, judgment is performed as to whether the amount of solder remaining in solder cup 70 is Yg or less using the sensor used for indicating that preparation for solder exchange work should be performed. Using an existing sensor means that costs are lowered.

Further, the amount of solder remaining in solder cup 70, that is remaining amount Yg shown in FIG. 7, at which the solder supply amount decreases rapidly due to the influence of differential head varies based on the viscosity of the solder and so on. Specifically, for example, there are cases in which the solder supply amount decreases rapidly when the solder remaining amount is (Y+β) g. In a case like this, it is necessary to judge whether the amount of solder remaining in solder cup 70 is (Y+β) g or less.

Considering this, with solder supply device 26, it is possible to change the position of second photoelectric sensor 152 in the vertical direction by slide mechanism 156. Therefore, by sliding second photoelectric sensor 152 such that the bottom surface of solder cup 70 when the amount of solder remaining in solder cup 70 is (Y+β) g and the lower limit of the region in which laser light is emitted by second photoelectric sensor 152 match, it is possible to judge whether the amount of solder remaining in solder cup 70 is (Y+β) g using second photoelectric sensor 152. Thus, with solder supply device 26, it is possible to deal with variations in the remaining amount of solder at which the solder supply amount decreases rapidly due to the influence of differential head, and various types of solders can be handled.

Note that, as shown in FIG. 4, control device 160 includes first control section 180 and second control section 182. First control section 180 functions as the section that controls operation of air supply device 122 when the amount of solder remaining in solder cup 70 exceeds Yg. Second control section 182 functions as the section that controls operation of air supply device 122 when the amount of solder remaining in solder cup 70 is Yg or less.

Note that, in the above embodiments, solder supply device 26 is an example of a solder supply device. Solder cup 70 is an example of a solder container. Outer tube 72 is an example of an outer tube. Space 86 is an example of an air chamber. Nozzle section 88 is an example of a nozzle. Flange section 90 is an example of a piston. Air supply device 122 is an example of a moving device. Second photoelectric sensor 152 is an example of a detection sensor. Slide mechanism 156 is an example of an adjustment mechanism. Control device 160 is an example of a control device. First control section 180 is an example of a first control section. Second control section 182 is an example of a second control section.

Further, the present disclosure is not limited to the above example embodiments, and various changed or improved methods of embodiment are possible based on the knowledge of someone skilled in the art. Specifically, for example, in the above embodiment, as the amount of solder remaining in solder cup 70 at which the solder supply amount decreases rapidly, one value (for example, Yg) is set, and controller 162 judges whether the solder remaining amount is the set value or less based on the input value from second photoelectric sensor 152. Then, based on that judgment, operation of air supply device 122 is controlled by first control section 180 or second control section 182; however, it is possible to set values for multiple solder remaining amounts, and to control operation of air supply device 122 based on those values for multiple solder remaining amounts.

For example, in the graph of FIG. 7, in a case in which the solder remaining amount is Y to 550 g, the amount of solder supplied from solder supply device is largely fixed; however, strictly speaking the solder supply amount changes or decreases based on the decrease in the amount of remaining solder. Therefore, values for multiple appropriate solder remaining amounts may be set considering the relationship between the solder supply amount and the solder remaining amount. Specifically, for example, (Y+s) g and Yg may be set (Y<Y+S<500). For these setting values, on condition that the air supply amount per unit of time by air supply device 122 is fixed, the air supply time may be set as (A−B) seconds in a case in which the solder remaining amount is greater than (Y+S) g and 500 g or less, may be set as A seconds in a case in which the solder remaining amount is greater than Yg and (Y+S) g or less, and may be set as (A+C) seconds in a case in which solder remaining amount is Yg or less.

In such a case, a third photoelectric sensor may be arranged such that the bottom surface of solder cup 70 when the amount of solder remaining in solder cup 70 is (Y+S) g and the lower limit of the region in which laser light is emitted by the photoelectric sensor match. Also, controller 162, in addition to first control section 180 that controls operation of air supply device 122 in a case in which the remaining amount of solder is greater than Yg and (Y+S) g or less and second control section 182 that controls operation of air supply device 122 in a case in which the remaining amount of solder is Yg or less, includes a third control section that controls operation of air supply device 122 in a case in which the remaining amount of solder is greater than (Y+S) g and 500 g or less. By setting values for multiple remaining solder amounts as setting values for varying the solder supply amount, controller 162 is able to control operation of air supply device 122 even more finely based on the remaining amount of solder.

Also, for example, in the above embodiment, the position of solder cup 70 is judged using a sensor that uses the light characteristics of a laser light or the like; however, the position of solder cup 70 may be judged using a sensor that uses magnetism, magnetic force, electrostatic capacity, or the like.

Also, in the above embodiment, the air supply time is lengthened to increase the air supply amount to space 86 inside outer tube 72; however, the air supply amount per unit of time may be increased instead. Further, the air supply time may be lengthened and the air supply amount per unit of time may be increased together.

Also, in the above embodiment, solder supply device 26 that moves solder cup 70 by supplying air to space 86 demarcated by solder cup 70 and outer tube 72 and so on is used; however, a solder supply device that moves solder cup 70 using a drive source such as a cylinder device or electromagnetic motor may be used. For example, when using an electromagnetic motor, in a case in which the amount of solder remaining in solder cup 70 is greater than Yg, solder cup 70 may be moved with a specified motor force, and in a case in which the amount of solder remaining in solder cup 70 is Yg or less, solder cup 70 may be moved with a motor force greater than the above specified motor force.

REFERENCE SIGNS LIST

26: solder supply device; 70: solder cup (solder container); 72: outer tube; 88: nozzle section (nozzle); 86: space (air chamber); 90: flange section (piston); 122: air supply device (moving device); 152: second photoelectric sensor (sensor); 156: slide mechanism (adjustment mechanism); 160: control device; 180: first control section; 182: second control section

The invention claimed is:

1. A solder supply device comprising:
   a solder container housing liquid solder that is tubular and open at one end;
   a nozzle, for ejecting solder from the solder container, that is inserted into the solder container;
   a piston that is fixedly provided on an outer circumferential section of the nozzle and that is engaged inside of the solder container from the opening of the solder container;
   a moving device that moves at least one of the solder container and the piston such that the piston progresses into the solder container;
   a sensor that detects the relative movement distance of the solder container and the piston; and
   a control device that controls operation of the moving device such that solder is supplied from the tip of the nozzle by operation of the moving device;
   wherein the control device includes
   a first control section that controls operation of the moving device such that, in a case in which the relative movement distance detected by the sensor is less than a set distance, at least one of the solder container and the piston is moved with a specified force, and
   a second control section that controls operation of the moving device such that, in a case in which the relative movement distance detected by the sensor is equal to or greater than the set distance, at least one of the solder container and the piston is moved with a force greater than the specified force.

2. The solder supply device according to claim 1, wherein
   the moving device moves at least one of the solder container and the piston by supplying air,
   the first control section controls operation of the moving device such that, in a case in which the relative movement distance detected by the sensor is less than the set distance, at least one of the solder container and the piston is moved by supplying a specified amount of air to the moving device, and
   the second control section controls operation of the moving device such that, in a case in which the relative movement distance detected by the sensor is equal to or greater than the set distance, at least one of the solder container and the piston is moved by supplying an amount of air greater than the specified amount to the moving device.

3. The solder supply device according to claim 2, wherein
   the solder supply device is further provided with an outer tube that is tubular with an opening at one end and that stores the solder container in a state when an other end of the solder container is inserted through the opening of the outer tube, and
   the solder container is moved by air being supplied to an air chamber that is demarcated by the other end of the solder container and an other end of the outer tube.

4. The solder supply device according to claim 1, further comprising:
   an adjustment mechanism to adjust the arrangement position of the sensor in the movement direction of at least one of the solder container and the piston.

* * * * *